United States Patent [19]
Berger et al.

[11] Patent Number: 5,258,246
[45] Date of Patent: Nov. 2, 1993

[54] DEVICE MANUFACTURE INVOLVING LITHOGRAPHIC PROCESSING

[75] Inventors: Steven D. Berger, Chatham, N.J.; John M. Gibson, Champaign, Ill.

[73] Assignee: AT&T Bell Laboratories, Murray Hill, N.J.

[21] Appl. No.: 913,509

[22] Filed: Jul. 14, 1992

Related U.S. Application Data

[63] Continuation-in-part of Ser. No. 498,179, Mar. 23, 1990, Pat. No. 5,130,213, which is a continuation-in-part of Ser. No. 390,139, Aug. 7, 1989, Pat. No. 5,079,112.

[51] Int. Cl.$^5$ .............................................. G03F 9/00
[52] U.S. Cl. .................................... 430/4; 430/5; 430/296; 430/311; 430/395; 430/396; 430/494
[58] Field of Search ............... 430/4, 296, 311, 395, 430/396, 494, 5

[56] References Cited

U.S. PATENT DOCUMENTS

| | | | |
|---|---|---|---|
| 3,105,761 | 10/1963 | Foris | 430/4 |
| 3,630,598 | 12/1971 | Little | 359/564 |
| 3,687,535 | 8/1972 | Heurtley | 359/558 |
| 5,079,112 | 1/1992 | Berger et al. | 430/4 |
| 5,130,213 | 7/1992 | Berger et al. | 430/4 |

OTHER PUBLICATIONS

Nakayama, Y. et al, J. Vac. Sci. Technol. B8(6), pp. 1836–1840, Nov./Dec. 1990.

*Primary Examiner*—Janet C. Baxter
*Assistant Examiner*—Thomas R. Neville
*Attorney, Agent, or Firm*—George S. Indig

[57] ABSTRACT

Fabrication of devices of micron and submicron minimum feature size is accomplished by lithographic processing involving a back focal plane filter. A particularly important fabrication approach depends upon mask patterns which produce images based on discrimination as between scattered and unscattered radiation by accelerated electrons. Use of such masks is of value as applied to scanning systems providing for dynamic correction of aberrations by physical movement of or field shaping of the objective lens to maintain the optical axis coincident with the scanning information-scanning beam.

39 Claims, 4 Drawing Sheets

DEVICE MANUFACTURE INVOLVING LITHOGRAPHIC PROCESSING

This is a continuation-in-part of co-pending U.S. patent application Ser. No. 07/498,179, filed Mar. 23, 1990, now U.S. Pat. No. 5,130,213 which, in turn, is a continuation-in-part of U.S. patent application Ser. No. 07/390,139 filed Aug. 7, 1989, now issued as U.S. Pat. No. 5,079,112, both of which are hereby incorporated by reference.

BACKGROUND OF THE INVENTION

TECHNICAL FIELD

The invention is concerned with the fabrication of devices by procedures including lithographic delineation. Contemplated devices may be discrete or integrated but have the common characteristic of being dependent upon feature size or spacing which may be as small as a micrometer or less. Semiconductor integrated circuits are critically dependent on small dimensions, and future generations are expected to benefit by the invention. Prospectively, integrated circuits will increasingly include optical devices, and these too will be advanced by the inventive teaching.

TERMINOLOGY

The arts involved, commercial as well as scientific, make use of a variety of terms which are not consistently applied. It is convenient to define terms as used in this document. Following definitions are in terms of electron lithography— the area of prime importance as well as that of greatest need of definition. Terms as applied to x-ray or other electromagnetic radiation are analogous.

Electron Beam Projection Lithography

Lithographic system entailing simultaneous illumination of at least a significant portion of a mask with an electron beam to result in a projection image of such portion. Contemplated systems depend upon imaging by masks illuminated by accelerated electrons. While much of the description is in terms of transmission masks, patterning may be the consequence of reflection masking. The term is not intended to include imaging by unaccelerated low energy electrons as directly produced upon photo illumination of a photo cathode.

Described systems permit mask-to-image reduction to minimize effects of imperfections such as pattern edge roughness or simply to provide for needed miniaturization. For many purposes, reduction may be up to tenfold or greater. One-to-one imaging, as well as magnification, are also permitted.

Mask

A fabrication tool which, when illuminated by unpatterned electron radiation, patterns such radiation to ultimately yield an image defined by relatively low and high electron intensities on the image plane (generally on the surface of the device being fabricated). While a mask is generally deliberately fabricated for contemplated use, the possibility that it may constitute or include a naturally occurring image-producing pattern such as that of a crystallographic lattice is contemplated.

For expediency the term "mask" may be used to describe the pattern source as used in a form of the invention which entails reflection rather than transmission. While much of the description is unchanged, as now visualized, the inventive teaching contemplates use of a reflection mask. Consistent with the generic teaching, resolution excellence is dependent upon a back focal plane filter (as defined below) which differentiates image-forming energy on the basis of scatter angle. Strictly speaking, the reflection mask mode depends upon "non-specular" and "specular" reflection regions (rather than on "blocking" and "transparent"). While the reflection mask may, as indicated, function in the same fashion as the transmission mask, a requirement is relaxed. Since the reflection mask is not in-line with the optical axis, non-specular reflection need not entail a large fraction of incident radiation-may be replaced by absorption or, in some instances, by transmission. In the extreme case, therefore, a reflecting mask may functionally consist of reflection regions which are specularly reflecting.

Blocking

Mask regions resulting in a degree of electron attenuation in the image which is of consequence in device fabrication, e.g. with regard to resist or other imaging material.

Transparent

Mask regions resulting in a degree of electron attenuation in the image which is small relative to blocking regions in terms of device fabrication, e.g. with regard to resist or other imaging material.

Absorbing

The characteristic, generally discussed in terms of blocking regions, entailing a degree of reduction in transmitted energy relative to illuminating energy.

Scattering

The angular change in direction experienced by electrons during transmission through a material, generally in terms of beam electrons during passage through a mask. Scattering may be elastic or inelastic and under many conditions both are manifested. Inelastic scattering, most evident in material which absorbs at concerned electron energies, may result in "chromatic aberration"—a change in wavelength with implications on focal distance and, therefore, on image quality.

For ease of description reference is made to "scattered" and "unscattered" energy. In principle, transmitting energy experiences some degree of scattering, however small, upon passage through any real material-presence of a scattering feature, however far from the transmitting energy, in principle, results in some change in direction. Terminology is defined in terms of lithographically significant effects—e.g. "unscattered" may connote the range up to the maximum scatter angle selectively passed through some subsequent aperture.

Edge Scattering

This term has reference to electrons which are transmitted through the interface between blocking and non-blocking mask regions regardless of mechanism. For the usual situation for which the interface is nominally vertical (perpendicular to the mask plane), affected electrons are traveling in directions outside the beam limit. Scattering may be elastic or inelastic, may be the consequence of but a single event, or may be the result of two or more scattering events. Edge diffraction as ordinarily regarded, while a contemplated contributor to edge scattering, is ordinarily of small magnitude and accordingly of little or no lithographic significance (for contemplated e-beam lithography in which wavelength is small relative to minimum feature size).

Back Focal Plane Filter

Filter having two or more areas of differing transmissivity for electrons of the same velocity. As used herein, choice of area is dependent upon scattering. In an embodiment, the filter provides for selective transmission of "unscattered" (including low-angle scattered) electrons and takes the form of an absorbing member provided with an aperture of size determined by desired scattering angle limitation. Alternatively, the filter may be of design to selectively transmit electrons scattered to values within any desired scattering angle range. Placement of the filter is in any event at or in the proximity of the back focal plane of the objective lens or in the proximity of any conjugate plane in the imaging system. The terminology "back focal plane filter" as used herein is intended to encompass any such filter placement. Aperture size (at least for usual round on-axis apertures) is described in terms of maximum angle of acceptance for incoming radiation. (Mathematically, the tangent of this angle is equal to the radius of the aperture divided by the focal length of the associated lens.)

Imaging Material

Material within which the projection image is produced. In general, a transitory material e.g. "resist" is contemplated although the material may be retained in the fabricated device—as modified or unmodified due to image exposure.

Minimum Feature Size

As used herein this is the dimension of the smallest feature or spacing between features routinely produced as measured on the device. As discussed, this is the dimension generally used in device description; e.g. reference to "1 megabit chip", generally the present state-of-the-art semiconductor chip, represents a minimum feature size of $\sim 1$ $\mu$m—usually the gate size of any included field effect transistor.

A number of other terms are used in the literature. While of complex and sometimes varying definition, such terms generally scale with minimum feature size. "Design rule" to many is synonymous. "Minimum line width" while defined in somewhat different terms, is a near-synonym. All such terminology and other dimensional terminology as well, as reported in the literature, is to be interpreted very carefully.

Transmission

Intensity of irradiating electrons in image regions corresponding with transparent mask regions as normalized relative to such intensity as incident on the mask.

Image Contrast

The difference in intensity of irradiating electrons as between image regions corresponding with blocking and transparent mask regions normalized to such intensity in image regions corresponding with transparent mask regions.

Edge Acuity

The distance over which contrast falls to one-half the image contrast as measured at the boundary between image regions corresponding with blocking and transparent mask regions.

Reflection Mode Terminology

The artisan will have no problem applying the inventive teaching to use of reflection, rather than transmission, masks. As in transmission, some simplification in terminology is expeditious. For example, no real surface results in truly specular reflection. Differentiation, as between regions corresponding in function with the "transparent" and "blocking" regions of the transmission mode, again concern degree of angular deviation from perfect specular reflection. The back focal plane filter again serves the function of selectively passing image-defining information within, or (for reverse tone) beyond the scatter angle deviation permitted relative to true specular reflection.

Rather than complicate the description, reliance is had on the reader to regard the teaching in the generic sense (depending on reflection as well as transmission) even though description is largely in terms of transmission.

DESCRIPTION OF THE PRIOR ART

Art of consequence is concerned with fabrication of devices which involves one or more lithographic delineation procedures. Most significant devices in this category to date are semiconductor devices although procedures have been otherwise applied, and still other forms of devices are of prospective interest. State-of-the-art semiconductor Integrated Circuits are now fabricated to minimum feature size of $\sim 1$ $\mu$m. Such devices use a variety of lithographic procedures designed to yield positive or negative images to bring about selective processing, e.g. etching, implantation, diffusion, deposition, etc. Design and process evolution as well as likely directions to be taken for next-generation devices are described in *Semiconductor Lithography Principles, Practices and Materials*, W. M. Moreau, pp. 420–431, Plenum Press, New York, 1988.

A typical process yielding ICs one centimeter across and containing up to a million devices built to minimum feature size of $\sim 1$ $\mu$m depends upon exposing and developing a resist layer by illumination with near ultraviolet radiation e.g. by means of an absorbing type mask. Both proximity printing and projection printing find use. Considerable thought and experimentation worldwide are directed to future generation ICs. Near-term minimum feature size reduction (to minimum feature size of $\sim 0.5$ $\mu$m) is expected to depend upon similar systems based on shorter wavelength illumination in the near ultraviolet spectrum. Requisites such as optics design and resist formulation, are at an advanced stage.

A following generation, down to minimum feature size of $\sim 0.35$ $\mu$m, is not so well advanced. Some believe that lithographic delineation will depend upon shorter wavelength radiation in the deep ultraviolet spectrum.

Generations after that, devices fabricated to minimum feature size of less than 0.35 $\mu$m, and those of minimum feature size at or below 0.2 $\mu$m are already under active study. Mask fabrication approaches are at a very early stage of development. Operability of devices built to such specifications is established on the basis of fabrication entailing direct electron beam writing. (This technique, "direct write", is characterized by relatively low throughput, and is not expected to satisfy desire for large quantity production e.g. for memory devices.)

It is recognized that significant commercial realization of devices in this category will rely upon further advances in mask fabrication of devices. It is clear that wavelength limitations of ultraviolet radiation now in use make it unsuitable for imaging. While use of mask-to-image reduction permits passage of such radiation through the mask, it cannot be used to define minimum features smaller than its wavelength. Reliable production with reasonable yield is believed to require still further reduction in wavelength, to some fraction of minimum feature size. For 0.2 $\mu$m minimum features, radiation of wavelength of 500 Å (0.05 $\mu$m) or smaller is desired. Prospective mask manufacture in this last category has generally contemplated use of electromagnetic radiation in the x-ray spectrum.

Development of a suitable x-ray delineation approach has been difficult. Nevertheless, intense worldwide activity, while recognizing the many obstacles, shows progress. Major problems include limited source brightness, unavailability of x-ray optics, and poor absorption. Most advanced systems depend upon synchrotron sources.

The present state of development of x-ray optics results in most efforts to date taking the form of proximity printing (which in turn gives rise to the need for very close spacing between mask and exposure medium). As an example, use of x-ray wavelengths of about 10 Å typically requires mask-to-substrate spacing of about 10 $\mu$m for resolution of 0.2 $\mu$m features. Danger of mask breakage is significant for this spacing. While such a facility has been demonstrated, it used sources, masking approaches and other conditions not readily adapted to commercial practice. For example, exposure times in such demonstrations have typically been of more than an hour's duration.

At one time there was a considerable effort directed toward use of accelerated electrons in lieu of electromagnetic radiation. The effort continued apace with e-beam direct writing and to some extent contributed to advances in electron optics and in resist chemistry. A particular line of endeavor was pursued in the United States, Germany and in Japan. (See, *J. Vac. Sci. Technol.*, 12(6), Nov./Dec. 1975, "Electron-projection Microfabrication System"; *J. Vac. Sci. Technol.*, 16(6), November/December 1979, "Aligned Multilayer Structure Generation by Electron Microprojection"; *Proceedings of the 11th Conference* (1979) (*International*) *on Solid State Devices*, Tokyo, 1979; *Japanese Journal of Applied Physics*, Vol. 19 (1980) Supplement 19-1, pp. 47-50, "Demagnifying Electron Projection System".) This effort, which appears to have been most actively pursued in the late '70s, was generally directed to miniaturization beyond that thought to be offered by the then usual fabrication procedures. Reports are generally directed to minimum feature size at the ~1 $\mu$m to 0.5 $\mu$m level. Apparatus used represents a considerable degree of development and certainly demonstrates feasibility in terms of electron optics, registration and alignment, as well as of sources yielding adequate intensity and, therefore, reasonable exposure times.

The effort, for the most part, made use of absorbing masks (as then and now in use in visible and UV lithographic fabrication). The cited work makes use of self-supporting aperture masks although it was later suggested that a membrane-supported structure of the type used in x-ray fabrication could be substituted. (See, *IBM Tech. Disclosure Bull.*, (USA), Dec. 1977, Vol. 20, no. 7 pp. 2868-71, "Fabrication of E-beam Projection and x-ray Masks on a Support Frame".)

History shows that the major objective of the electron mask approach was satisfactorily met by lithographic delineation based on electromagnetic radiation of wavelength within the near UV spectrum. Literature study shows that efforts toward still smaller minimum feature size has concentrated on the electromagnetic radiation route as well (first deep UV and finally x-ray).

There has been little literature directed to e-beam projection fabrication in recent times. It may be that chromatic aberration (and to some lesser extent elastic scattering) implicit in use of absorption masks explains emphasis on x-ray. As discussed in conjunction with FIG. 4, required thick absorption regions in conjunction with the (incomplete) nature of the absorption phenomenon itself, gives rise to electrons escaping from the edge of the absorbing region. Associated resolution limitation is a consequence of such electrons being improperly transmitted/blocked due to either of two mechanisms. Electrons as initially scattered or as misdirected due to reduced energy are improperly captured or excluded.

The history of conventional transmission electron microscopy is relevant to this discussion. Constant demand toward resolution of finer and finer features has been attended by design alterations. A consequence is very thin specimens as well as high accelerating voltages—both to expedite resolution of such small features. Both are attended by lowered absorption, by a degree of absorption inadequate to resolve features, and just as important, inadequate for replicating a grey scale needed for resolving detail within "blocking" regions. The now familiar solution to the problem is in a mode of electron microscopy known as "Scattering Contrast Transmission Electron Microscopy". This mode relies upon imaging as based upon the degree to which electrons experience scatter upon transmission through the specimen. Such imaging is dependent upon an apertured back focal plane filter. The principle of the operation is well known—unscattered electrons are selectively transmitted or blocked depending upon placement of the aperture. Replication of adequate grey scale is due to dependence of transmission on scattering angle.

SCTEM has been of undeniable significance but in turn presents certain problems not shared by conventional imaging based on absorption. A major problem has to do with aperture size. Conflicting design needs result from image contrast as implicitly dependent upon small aperture size which in turn limits feature size which may be resolved due to diffraction limitations. This led to enlarging of the aperture to result in reduced scattering contrast. As a consequence, new imaging methods, based for example on phase contrast, have emerged.

The history of electron microscopy is understood in terms of unavoidable specimen characteristics, e.g. contrast and size as discussed, together with required magnification typically to values $\geq 10,000$ (within a range of perhaps $100x - 10^6x$).

SUMMARY OF THE INVENTION

Device fabrication and resulting devices depend upon one or more lithographic projection procedures with capability of defining minimum size features of minimum dimensions 1 μm and below. Aspects of the invention entail submicron minimum feature size at or below 0.5 μm. Prospective devices described in the literature require a variety of minimum feature sizes, e.g. 0.35 μm, 0.25 μm, 0.2 μm and below. The invention is suitably applied to fabrication of such devices. Fabrication procedures entail image formation which is to some substantial extent effected by selective passage of lithographically defining energy dependent upon scattering during transmission through a mask.

(As above, for expediency, description is largely in terms of use of a transmission mask. Contemplated use of a reflection mask requires some slight reinterpretation of the language used. In this mode, for example, "selective passage" is considered to encompass the equivalent "specular reflection" (within the angular deviation permitted by the back focal plane filter), etc.)

An important class of such lithographic procedures depends on beam illumination of a mask containing a pattern defined by "blocking" and "transparent" regions which scatter transmitting illumination energy to respectively large and small extent so as to permit pattern replication on an image plane. Scattering-dependent transmission is by a filter—generally an apertured filter—which, relative to the object plane of the mask is on a "back focal plane" (defined as including equivalent conjugate planes) of the lens system. While not so limited, this back focal plane filter is usually absorbing (like other terminology used in this description the term "absorbing" means to a level which is lithographically significant—e.g. 100% absorption is not required if a lesser percentage is sufficient for the contemplated processing). Provision of a filter aperture which is on the optical axis of the lens system results in selective passage of unscattered energy—in selective passage of energy passing through transparent mask regions. A complementary system of providing for selective passage of scattered energy blocks passage through an on-axis region of the filter. Such a filter which selectively passes scattered energy may take the form of a central absorbing region surrounded by transparent material or by one or more apertures. Again, either filter in fact provides for passage or non-passage of energy depending upon range of scatter.

Appropriate lithographically defining energy must be of such nature as to be scattered or transmitted in the above terms by "blocking" and "transparent" regions of masks which are expediently manufactured and used (e.g. in terms of structural material and thickness). A variety of energy forms are suitable from this standpoint. Inventive signficance is primarily in terms of energy of properties inherently suited to micron and submicron feature size definition. A preferred system relies upon electrons sufficiently accelerated for appropriate fine feature resolution. Specific discussion is in terms of acceleration within the 50–200 kV range. Maximum acceleration is likely to be limited by device-consequential material damage. In general, still greater acceleration results in improvement e.g. in terms of depth of focus and penetration depth and may be indicated depending upon device design demands. The inventive fabrication systems may result in product advantages as used with electromagnetic radiation energy e.g. in the x-ray spectrum as well. While the electron beam projection approach as generally contemplated by the invention entails initial illumination of the mask by already-accelerated electrons, the invention is of other value. For example, photo illumination of a photo cathode to result in mask illumination by unaccelerated electrons may benefit by the inventive teaching. This version of the invention involves acceleration of the already mask-patterned radiation. Resulting accelerated electrons as permitted by the back focal plane filter have the described advantages with respect to depth of focus and penetration depth. In addition, the back focal plane filter may increase edge acuity by differentiation based on scatter angle.

Most significant near-term use of the invention involves patterning of resist materials. In general, delineating energy chosen for high resolution or low damage has little direct effect on device-functional properties of usual materials being processed. This is particularly true of an important category of processes which depend on electrons accelerated within the 50–200 kV range or higher. Such energized electrons are not locally absorbed within thin surface regions but penetrate to significant depths, sometimes completely through the article being fabricated. It is a feature of the invention that the very small concentration of damage-induced defects minimizes deterioration of device-significant characteristics.

Inventive species may, nevertheless, depend on direct or indirect change in device properties based on patterned illumination. One species involves simultaneous illumination and processing to result in illumination-dependent change in processing rate e.g. selective deposition as a consequence of decomposition or reaction selectively induced by illumination. Etch rate, too, may be affected positively or negatively by illumination.

The inventive approach enjoys marked advantages relative to x-ray fabrication—both in terms of proximity and projection printing. In usual x-ray systems, imaging depends on differentiation between energy passing through absorbing and transparent mask regions. X-ray wavelengths, appropriate to minimum feature size generally sought, require blocking regions in the mask of sufficient thickness to result in edge scattering resolution loss. Use of a back focal plane filter lessens resolution limitation due to edge scattering. This advantage may be of significance for absorption-transmission masking systems using other forms of electromagnetic radiation as well as for other scattering-non-scattering masking systems. In this connection it is useful to note that the inventive approach may be of value in the fabrication of devices based on minimum feature dimensions which are not precluded due to wavelength limitations of other lithographic techniques. For example, even where such dimensions exceed 1 μm, improvement in edge acuity inherent in the version of the invention selectively passing unscattered energy may be of consequence e.g. in expediting registration. Edge acuity values of 0.2 μm and 0.1 μm have been experimentally observed.

Suitable to contemplated submicron minimum features, the inventive approach may expedite in-situ processing. For example, electron imaging in accordance with a preferred form of the invention is desirably carried out in an evacuated atmosphere. This is consistent with other procedures which might precede or follow imaging. Examples are deposition procedures such as Molecular Beam Epitaxy and Chemical Vapor Deposition. Such compatibility favors device fabrication without need for changing apparatus or breaking vacuum, and so lessens contamination.

A significant part of the inventive teaching is in terms of device fabrication and resulting products. In the main, such description contemplates at least one level of imaging using the preferred accelerated electron approach, primarily in terms of scattering - non-scattering masking. As discussed, preference is generally for acceleration voltages equal to or greater than 100 kV.

Fabrication procedures using electron imaging gain advantage from registration/alignment and inspection facility which may be done electronically (which do not require mechanical stage movement commonly used with electromagnetic radiation patterning). A major advantage is depth of focus particularly as reinforced by penetration depth. This combination gives rise to expedient device fabrication including a level at which imaging is carried out on a stepped surface (as produced by etch-removal). Depth of focus permitted for 100 kV electrons easily accommodates the 1 $\mu$m or greater steps generally used and contemplated for fractional $\mu$m design rules.

Penetration depths, also sufficient to accommodate 1 $\mu$m or greater distances, expedites processing, e.g. expedites resist coverage of bared vertical surfaces. Such advantages are due to relative independence of electron exposure relative to material (e.g. resist) thickness.

While the inventive approach may avoid need for planarization, it may also expedite planarization where desired. There is a view that planarization is useful, for example, in assuring metal coverage in fabrication of devices at ~0.4 $\mu$m design rules.

Workers have made use of a form of dynamic correction in electron projection systems to maintain image quality in systems in which the projected image is made up of joined regions corresponding with successive mask regions. One such system depends upon variation in focal length to accommodate imaging entailing an annular shaped sub-image of varying radius—e.g., of regions initiating with a central round region, in turn, yielding annular regions of increasing radial separation from the center. Another such system provides for field shaping of the objective lens to maintain coincidence between the optical axis of the lens and an image-defining scanning beam. VAL and, more recently, VAIL systems based on this approach, are described in the literature (see, references cited under "Imaging Apparatus" below). All such systems benefit by substitution of the present scattering for the absorption mask-blocking regions of earlier work.

Much attention has been given to the "proximity effect" associated with accelerated electron imaging. The effect, due to unwanted exposure by scattered electrons, may cause problems in terms of resolution and also in terms of exposure differences as between small and large pattern areas. In scanning beam writing, consequences of the effect may be reduced by changing scan rate or beam intensity. In the projection lithography of the invention accommodation may take the form of changes in pattern density in different regions of the mask. The effect is lessened by proper selection of accelerating voltage values.

Yield improvement, as well as fabrication economy, is gained from greater tolerance of slight warpage or misplacement of mask and/or substrate.

DETAILED DESCRIPTION

1. Drawing

FIG. 1

Figure 1:
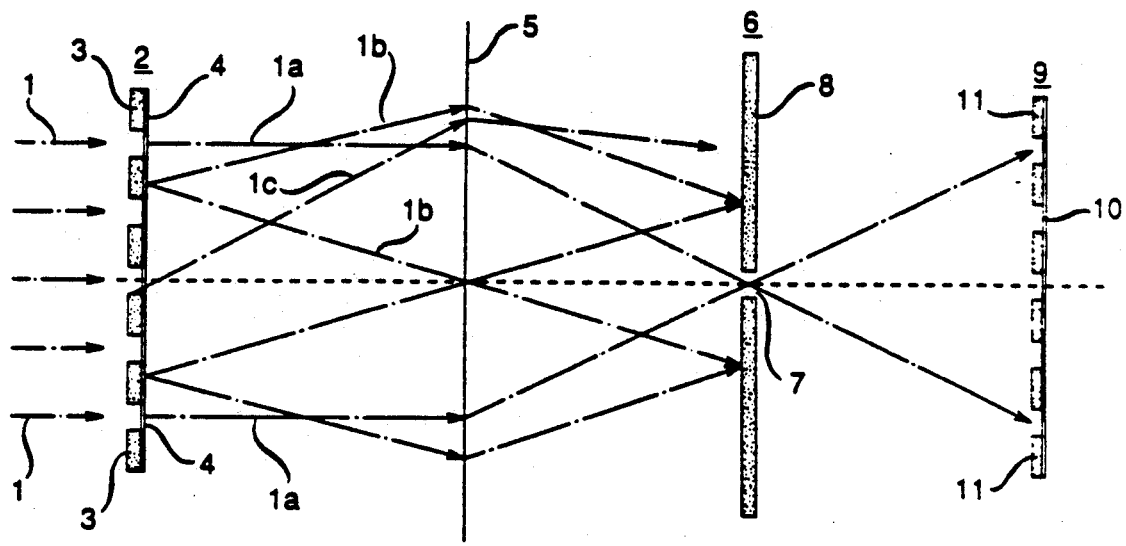
FIG. 1 is a diagrammatic view illustrating principle of operation of a back focal plane filter designed to selectively pass unscattered energy.

The single lens system depicted makes use of beam electrons, or other delineating energy, identified as rays 1 incident on mask 2 which includes blocking regions 3 and transparent regions 4. Rays transmitted through transparent regions 4, are identified as rays 1a while those transmitted by blocking regions 3 are identified as rays 1b. Such rays are refracted by lens 5 with emerging rays made incident on back focal plane filter 6. As schematically depicted rays 1a pass through filter aperture 7 to result in image 9 consisting of replicated illuminated regions 10 and unilluminated regions 11. Rays 1b scattered beyond a critical scattering angle, do not pass through aperture 7, but instead are absorbed or otherwise blocked by the non-apertured portion 8 of filter 6.

FIG. 2

The complementary system in which scattered energy is selectively used to form the image in this FIG. Here, scattered rays 1b pass through apertures 17 while transmitted rays 1a are now stopped by filter region 18. Image 19, a negative of image 9, results from selective illumination of regions 21. Regions 20 are unilluminated. In contemplated apparatus, the back focal plane filter is absorbing (although alternative designs may make use of forms of scattering such as Bragg scattering, etc.).

Rays 1c are depicted as energy scattered within a blocking region 3 so as to result in escape before complete transmission. The phenomenon is of very small amplitude for the version of the invention principally discussed—for the version which depends upon imaging based primarily on scatter-nonscatter masking. As considered in the description of FIG. 5, it is statistically more likely for thicker blocking regions such as are necessarily used for absorption-transmission masking.

As depicted, edge scattering of sufficient angle results in blockage by the back focal plane filter 6 in the same manner as for rays 1b. As later discussed, rays 1c may be due to simple elastic scattering or may be the consequence of one or more energy-absorbing events to result in inelastic scattering. Inelastic scattering, with its inherent energy reduction, results in chromatic aberration to add yet another influence statistically reducing likelihood of capture within the angle subtended by aperture 7, i.e. as due to lens dispersion (change in focal plane due to energy loss).

The implication is clear. Use of a back focal plane filter in conjunction with an imaging system dependent upon absorption nevertheless benefits by the inventive teaching. Edge resolution deterioration, limiting in absorption imaging projection systems, for electromagnetic radiation as well as for electron radiation, is alleviated.

FIG. 3

Data here presented, in the form of contrast curve 30 and transmission curve 31 is based on calculated values for an e-beam system. In this system, electrons accelerated to a level of 175,000 electron volts are made incident on a mask consisting of a 0.5 μm thick membrane of silicon oxynitride, supporting a 650 Å thick pattern of elemental gold. While such gold blocking regions serve the entirety of the lithographic function, an interposed 100 Å thick layer of chromium serves to assure adherence. Information of this form for the chosen radiation may be used to select appropriate operating property in terms of e.g. resist characteristics. (For a description of silicon oxynitride, a material familiar to many workers in this field, see "Thin Film Processes", edited by J. L. Vossen and W. Kern, Academic Press N.Y., 1978 pp. 299–300.)

FIG. 4

Apparatus 40 depicted in this FIG. includes electron or other energy source 41, condenser lens system 42, mask 43 consisting of blocking regions 44 and transparent regions 45, objective lens 46, back focal plane filter 47 shown as provided with on-axis aperture 48, projector lens system 49, exposure medium 50 shown as embraced by elements 51 and 52 which together constitute registration and alignment system 53. Apparatus 40 is completed by vacuum chamber 54 and air lock 55, the latter providing for specimen exchange.

The apparatus depicted serves as the basis for description of suitable optics. In these terms, it is to be contrasted with FIG. 1 which is intended solely as a schematic serving as basis for discussion of the fundamental principles involved. The apparatus of FIG. 4 has separate condenser and projector lens systems. This is preferred to facilitate focusing with minimum mechanical adjustment. Physical movement of the mask or the device in process, while certainly feasible increases apparatus cost and is likely to result in a time penalty as well. There is a further preference for multiple lenses in the projector system. For example, use of two or more lenses is useful to allow correction for image distortion and other aberrations, and to control image rotation as well. (See, M. B. Heritage: "Electron-projection Microfabrication System", *J. Vac. Sci. Technol.*, Vol. 12, No. 6, November/December 1975, pp. 1135–1139.)

Many workers concerned with lithographic fabrication at minimum feature size of 1.0 μm and below have considered reduction systems. Mask quality is improved and one contribution to image deterioration is lessened. The advantages must be balanced against resulting disadvantages. For example, effect of radial drop-off in intensity, particularly for electron illumination, is aggravated by use of larger masks. For present state of development, this may require step-and-repeat. Equipment design permits image enlargement, as well as reduction and 1:1. While generally disadvantageous for the reasons discussed above, other circumstances may suggest the approach. Masks based on naturally occurring patterns-perhaps of atomic dimensions-may require enlargement.

Mask 43 is shown with the blocking regions 44 constituting the pattern on the underside of the membrane relative to the electron source. This is preferred due to the "top-bottom" effect. (See, "Transmission Electron Microscopy: Physics of Image Formation and Microanalysis", L. Reimer, published by Springer-Verlag 1984, pp 172–176.)

Reference to M. B. Heritage, cited above, is illustrative of the state of development of electron optics. In general, lens and other design parameters are quite advanced. Little change in design is suggested by substitution of scattering type masks in accordance with a preferred form of the invention.

FIG. 5

Figure 5:
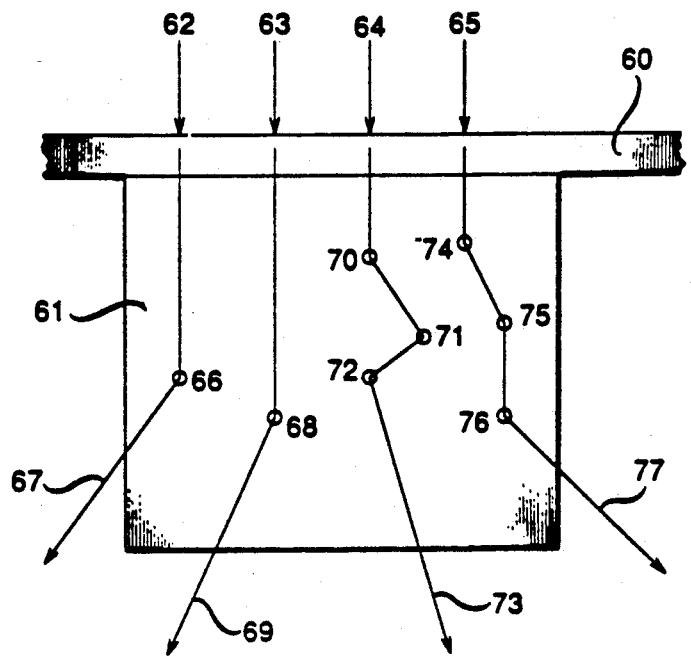
FIG. 5 is a diagrammatic view showing some types of scattering experienced within a blocking mask region. The figure is intended to illustrate effects of elastic as well as inelastic scattering to result in energy which is "edge scattered" or which is scattered as exiting from the underside of the region.

FIG. 5 is a cross sectional view of a mask portion including membrane 60 supporting blocking region 61. The purpose of this figure is to serve as basis for discussion relating to the various phenomena which may be experienced by lithographically defining energy within the blocking region.

Reference is made to four energy rays as made incident on membrane 60 to be transmitted into blocking region 61. Ray 62 experiences a single scattering event 66 to result in edge scattered ray 67 shown as escaping blocking region 61. Event 66 may be elastic or inelastic. Ray 63 also experiences but a single scattering event 68 to result in ray 69 exiting after transmission through the entire thickness of blocking region 61. Event 68, like 61, and like other events depicted in this figure may be elastic or inelastic. Ray 64 experiences three scattering events, 70, 71, 72, to result in ray 73, like 69 exiting at the underside of blocking region 61. Ray 65 also experiences multiple scattering events, 74, 75, 76, to result in edge scattered ray 77.

Rays 69 and 73 are illustrative of scattered energy rays likely to play a role in various forms of the invention. The experience of ray 63 is illustrative of the phenomenon upon which scatter-nonscatter imaging of the invention is dependent. In this form of the invention, material and thickness of blocking region 61 are chosen to favor a small number of elastic collisions. Statistical assurance of image-significant degree of scatter may take the form of design providing for three collisions as depicted for ray 64. This statistical assurance is consistent with a blocking region which is thin relative to that needed for absorption masking. Thin blocking regions, desirable from the standpoint of fabrication, temperature stability, etc. inherently lessen likelihood of edge scattering as depicted for rays 62 and 65.

As discussed in conjunction with rays 1c of FIG. 1, edge scattering, as occurring in blocking regions dependent upon absorption, is likely to be due to inelastic collisions. Energy loss, the consequence of partial absorption, reduces the energy level of the radiation (in the instance of electron irradiation results in decreased velocity) to result in chromatic aberration. As discussed, frequency dispersion characteristics of the lenses constituting the optic system dictate direction change to result in such radiation being shifted on the image plane. In general, chromatic aberration increases the likelihood that affected energy will not be captured within the angle subtended by an on-axis filter aperture.

FIG. 6

Figure 2:
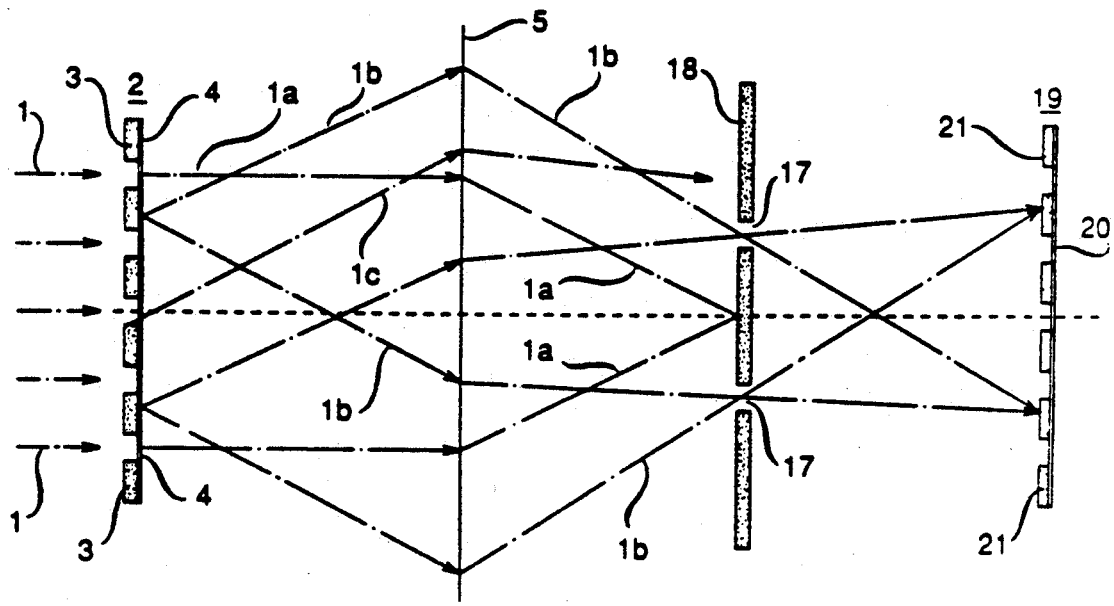
FIG. 2 is a diagrammatic view quite similar to that of FIG. 1 but illustrating principle of operation for the complementary system in which the back focal plane filter selectively passes scattered energy.

This figure depicts a mask working in the reflection mode. For ease of comparison with transmission mode it uses primed numbers corresponding with the unprimed numbers of FIGS. 1 and 2 for the transmission mask of that arrangement. In the figure, mask 2′ is made up of substrate 4′ supporting patterned regions 3′. Illumination is by e.g. collimated electrons shown as rays 1′. For the particular arrangement shown the free surface of substrate 4′ results in specular reflection of rays 1′ to produce reflected rays 1a′, while regions 3′ result in non-specular reflection (rays 1b′ manifesting some statistical angular deviation sufficient for differentiation relative to specularly reflected rays 1a′). The remainder of the apparatus, not shown, depends upon a back focal plane filter to selectively pass specular, or alternatively non-specular, radiation in the manner of the filter shown in FIGS. 1 and 2.

Design considerations for a reflection mode mask in an accelerated electron illumination system are known. See, for example, "Transmission Electron Microscopy: Physics of Image Formation and Microanalysis", L. Reimer, published by Springer-Verlag 1984, e.g. at p. 402. Specular reflection compatible with desirably minimized penetration, depends upon Bragg operation. Generally, use is made of very small glancing angles 100 in combination with crystalline surface layers made up of a few lattice planes (of a thickness of e.g. $\sim 10$ Å) now shown, within the surface of substrate 4′. Deviation of rays 1b′ from specular is the consequence of scattering within regions 3′. Apparatus arrangement for use with a reflection mode mask may depend upon a substrate position which is angularly complementary to that of mask 2′ (so as to attempt to equalize total transmission paths of all pattern-significant rays). Alternative arrangements, e.g. using back-to-back mask and substrate may use additional elements.

FIG. 7

Figure 7:
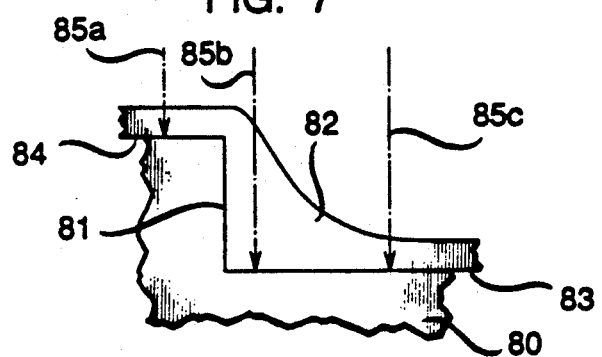
FIG. 7 is a diagrammatic view of a section of a device under fabrication in which electron imaging is being carried out on a stepped surface.

FIG. 7 depicts a portion of a device under fabrication in accordance with a preferred embodiment. The device at this stage includes stepped regions within body 80, with steps consisting of horizontal surfaces 83 and 84 interconnected by step surface 81. At the stage depicted, such surfaces are covered with protecting material, e.g. resist, 82. Processing at this stage entails illumination by rays 85a, 85b and 85c, for this purpose representing rays of collimated electrons accelerated, likely to a level of 100 kV or higher. As discussed, such energized electrons may be focused so as to exhibit a depth of focus sufficient to result in satisfaction of contemplated design rule requirements simultaneously on surfaces 83 and 84 (for a typical step height 81 of 1 or 2 $\mu$m for contemplated devices fabricated at design rules of fractional $\mu$m, e.g. 0.4 $\mu$m down to 0.1 $\mu$m).

The shape of the resist layer 82 conveniently produced by spinning, uses amounts of material and conditions as to assuredly protect all of surfaces 81, 83, 84 at the sacrifice of thickness uniformity. A significant advantage of the inventive approach is the essential independence of exposure depth of rays 85a, 85b, 85c with regard to thickness of material 82 traversed.

Figure 8:
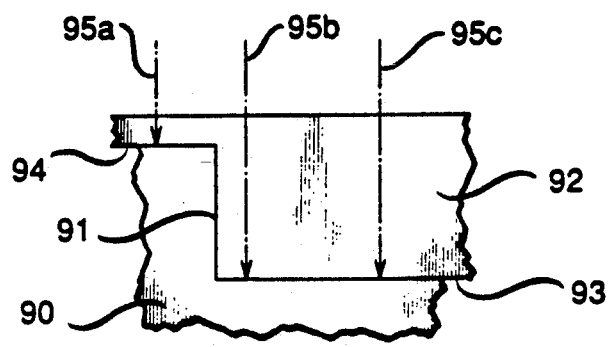
FIG. 8 is a diagrammatic view similar to that of FIG. 7 but depicting imaging as carried out on a planarized surface.

In FIG. 8 a device at the same fabrication stage as that depicted in FIG. 7, is shown as undergoing an alternative approach involving planarization. Even though many workers at this time consider planarization to be an undesirable procedure, likely to be utilized at design rules of $\sim 0.6$ $\mu$m and below, others believe that it may be desirable. At the stage shown, the device consists of a body 90 including a stepped surface 93-91-94. Planarization is accomplished by use of material 92. Patterning is by rays 95a, 95b, 95c which, again, immune to contemplated step height/material thickness both in terms of depth of focus and penetration depth, may satisfy e.g. 0.2 $\mu$m design rules simultaneously on planes 93 and 94 by $\sim 100$ kV electrons.

2. General

A prime aspect of the invention, that dependent upon use of accelerated electrons for image definition, has attributes of particular value in terms both of processing and product. Registration and alignment are considered by many to be a prime deterrent as design rules become smaller. Use of charged particles-of electrons-permits the electronic, rather than mechanical, positioning of image elements. Such positioning, which may use magnetic, as well as electric fields per se, is a known attribute. A useful positioning mechanism is described in the aforementioned reference "Electron-projection Microfabrication System", by M. B. Heritage. The term "positioning" is intended to encompass simple movement (displacement and/or rotation) of the image with respect, for example, to reference markings, perhaps on the substrate, as well as degree of reduction/enlargement perhaps by use of the same markings. Interaction as between the charged particles and the positioning field may take a variety of forms, e.g. may be based on a difference signal to result in a current feedback minimization approach.

An important advantage of the invention depends upon the relatively large depth of focus resulting from the equivalent short wavelength of the accelerated electrons.

This depth of focus can be of particular value when taken together with attainable electron penetration depths. Electrons, accelerated through the preferred voltage ranges described, particularly at voltages of 100 kV and greater, evidence sufficient penetration depth to result in delineation-modification of material over a far greater depth than attainable in previous projection systems.

The two characteristics, depth of focus and penetration depth, result in yield advantage with regard to unintended nonconformity of image plane and substrate surface (as due to improper, e.g. nonparallel, placement of mask and substrate or, alternatively, as due to warped mask or substrate). Yield advantage, or alternatively, time/material saving, is clear.

The same characteristics give rise to a processing approach generally considered unavailable in the fabrication of devices based on design rules of 0.5 $\mu$m or smaller. It is expected that fabrication of such devices by use of deep UV will make use of "planarization". Planarization takes many forms but is uniformly designed to account for depth of focus and penetration depth limitations of delineating photonic energy. A variety of planarization techniques are in use. (See, *Semiconductor Lithography Principles, Practices and Materials*, Chapter 6, W. M. Moreau, Plenum Press, New York, 1988.)

The inventive approach permits fabrication without planarization. An important aspect takes the form of a processing sequence involving delineation over a deliberately stepped surface as produced in prior processing. Permitted conditions provide a degree of flexibility to accommodate such a surface. The range of electron velocity values as dependent on choice of accelerating voltage, permits selection of conditions to provide desired penetration depth (in terms of statistical likelihood of desired electron-induced interaction e.g. exposure at a given depth). For example, choice of accelerating voltage values of 100 kV or greater, provides for resist exposure through a resist depth equal to that of usually contemplated step heights. This effect complements, and, together with depth of focus may simplify device fabrication. A recognized problem in processing a stepped surface is in maintaining thickness uniformity of resist on vertical edges. The problem may be avoided for properly selected electron acceleration voltages. Use of excess resist material, usually resulting in increasing thickness with depth but assuring reliable coating of vertical edges-presents little problem.

While this aspect of the invention may avoid the need for planarization, it should be noted that planarization may itself be expedited. Accordingly, it is unnecessary to resort to multifunctional coatings (e.g. to bilevel or trilevel resist) with their processing complications.

Acceptability of a stepped surface accommodates yet another processing objective-simultaneous delineation of patterns on different planes.

The relationship of depth of focus to wavelength is well-known and the reader is referred to standard texts on the subject for further detail as well as for special considerations. One such text is "Geometrical and Physical Optics", R. S. Longhurst, published by Lorgman (Norwich 1967) with particular attention to Chapter 14.

A useful equation for depth of focus for a relevant optical system operating in a medium of constant refractive index with diffraction limited resolution is given by $$D = cr\frac{\sqrt{4r^2 - \lambda^2}}{\lambda}$$

where:

D is depth of focus in terms of distance from the focal plane which reduces resolution by some value (here generally discussed as 50%)

r=resolution in terms of edge acuity-distance over which electron dose is reduced to some value (here generally discussed as 50%)

$\lambda$ is the equivalent wavelength of the accelerated electrons c=a constant of a value determined by the precise definition of D and r all in compatible units.

While this criterion is set forth in optical terms, available electron penetration depths are sufficient to assure sufficient uniformity of intended reaction over contemplated distances.

The inventive teaching is in terms of design rules including a range larger than that dictated solely on the basis of wavelength limitation. It is expected that the advantages described above may result in utilization in preference to photonic delineation at larger design rules within the stated range. As an example, the facility for step coverage, or for expedient planarization processing may dictate preference to ultraviolet radiation, e.g. at 0.4 $\mu$m design rules.

Proximity Effect

The terminology "proximity effect" is descriptive of a class of phenomena of significance in processes involving accelerated electron pattern delineation. The phenomena are due to exposure by scattered electrons, particularly back-scattered electrons. Scattering may be within resist or other material to be patterned, or within substrate material.

"Proximity effect", due to back scattering of accelerated electrons is known to have two harmful consequences in terms of delineation. The first, absorption of back scattered electrons in masked regions (e.g. of resist), results in resolution loss. This may be measured in terms of loss of edge acuity and may place a limitation on permitted line spacing.

The other consequence, under most circumstances due to back scattering from within underlying substrate, gives rise to variation in electron density within regions. This exposure variation is area dependent—of greater consequence for larger areas.

Area-dependent exposure can be controlled in scanning electron beam exposure systems simply by programming in a variation in electron density, for example, by varying scan rate. In a mask projection system, compensation may be by varying the scattering incidence by changing thickness of density in the mask. An alternative approach breaks a mask level into two or more separate levels on the basis of feature size. By either approach, compensation for area-dependence is by decreasing exposure for larger areas. As an example, a crossover might be for feature sizes below and above 10 $\mu$m. Useful crossover values may be determined experimentally. Knowledgeable workers in the field invoke this effect as a significant deterrent to accelerated electron mask lithography. In fact, experimental results to date, largely in terms of PMMA (polymethyl methacrylate positive tone resist) and silicon substrate—considered reasonably representative of conditions likely to be encountered—show the effect to be of small consequence. Acceptable results under experimental conditions thus far have required no adjustment to compensate for proximity effect. In the event that processing condition or material characteristics result in greater demands, processes herein may be modified to compensate for the effect.

Further discussion on this matter is not justified. Knowledgeable workers will address the effect in a variety of ways. It may be, for example, that economics will dictate a variation in processing as between successive levels. For example, while separation on the basis of area is discussed in terms of amenability to different electron exposure density, it may be that electromagnetic radiation will be indicated for mask levels restricted to larger feature size (UV or even visible radiation might suffice).

Contemplated Product

Discussion has largely been in terms of large scale integration generally electronic although photonic as well as hybrid circuitry has been mentioned. It is expected the inventive processes will be applied as well to mask fabrication. At this time, masks meeting demanding resolution requirements are made by electron beam writing. The inventive approach offers an inexpensive route to reproduction of such masks for use in actual device fabrication. A special value derives from facility for reduction. Master masks at scale chosen with a view to edge acuity demands may be replicated in smaller size, e.g. to offer 1:1 fabrication. It may be that such masks will be used with alternative forms of patterning energy—UV or x-ray—as well as in electron projection.

The inventive advance is properly discussed in terms of fabrication of devices—devices of interest for their operating characteristics based e.g. on small minimum feature dimensions and high packing density, as well as for their cost based on throughput, yield, etc. Many of the fabrication procedures are at an advanced state of development. Electron beam direct write fabrication procedures use resists, registration techniques and other procedures which may be transferred directly for use in e-beam projection systems of the invention. The same is true of procedures using other forms of lithographically defining energy. X-ray, while most advanced in terms of proximity printing, is under extensive study for use in projection systems. Again, x-ray resists, registration techniques, etc. are known. Ultraviolet projection systems, both in the near UV and the vacuum UV spectra, are in use or under development.

The single feature common to all aspects of the invention is selective passage of transmitted lithographic energy as dependent on angle of scatter introduced by the mask. The back focal plane filter serves this function regardless of the form of transmitted energy and, as indicated, may selectively pass either (1) unscattered energy or (2) scattered energy—perhaps as based on degree of scatter as well. For most purposes, selective passage of unscattered energy is the preferred approach, since it inherently blocks transmission of energy which is edge-scattered.

From a functional standpoint, the back focal plane filter, if designed to selectively pass unscattered energy, is provided with an aperture located on the optical axis of the lens system. In general, the filter element is constructed of absorbing material and depends upon this characteristic for blocking (in this instance for blocking scattered energy). Heating, particularly uneven heating, may be of serious consequence in causing shifting or distortion of the aperture, and to this end, cooling and/or heat sinking may be provided. The problem is alleviated by horizontal disposition of the filter and by other precautions which maintain uniform temperature about the aperture.

Design principles for the filter are known (and are regularly used in scattering contrast transmission electron microscopy). Design, largely in terms of aperture diameter, is simply with the objective of selective passage of energy based on scattering angle, however, with a view to the inventive objectives.

A feature of the scattering-nonscattering version of the invention; that of reduced need for heat dissipation in the mask, places a further responsibility on the filter. Heat dissipation perhaps $\geq 5$ watts is readily dissipated at least in the filter provided with an on-axis aperture. Unlike the mask, it is practical to construct the filter of relatively thick material of high-thermal conductivity (e.g., of copper or other metal).

Tone Reversal

It has been indicated that tone reversal of the same mask may be realized by appropriate design of back focal plane filters. This facility is realizable in accordance with preferred aspects of the invention dependent upon patterning as introduced by masks consisting of two basic types of mask regions which differ from each other in the degree of scatter imparted to the unpatterned (parallel) illuminating radiation. The effect is most pronounced for electron radiation, and accordingly, tone reversal is most desirably utilized in conjunction with such inventive species.

Use of scatter-nonscatter masking, in accordance with a preferred aspect of the invention is known to facilitate tone reversal. "Dark field imaging"—producing a negative image—in transmission electron microscopy is accomplished either by moving the back focal plane filter aperture off-axis or by tilting the illuminating electron radiation. See, Reimer, Transmission Electron Microscopy:Physics of Image Formation and Microanalysis, cited above As transferred to lithographic processing, this facility has several processing implications. For example, tone reversal may now take advantage of preference for e.g. positive over negative resist so that positive may be used for successive fabrication steps entailing reversal. Process simplification—use of but a single tone resist—is of itself desirable.

Contemplated tone reversal may accordingly take the form either of filter modification (replacement or adjustment of an appropriately designed filter), or of alteration of illumination angle. Filter modification, with a view to process requirements, most desirably does not take the simple form of displacing the center aperture for negative imaging. Image brightness, as well as edge acuity, may be improved by replacing the central circular aperture of the positive filter with a properly designed annular aperture surrounding a now blocking on-axis region. The radial width of the annulus determines resolution since it determines the range of scatter angle of illumination passed. The inner radius of the annulus is a significant factor in the determination of image contrast. In general, this gives rise to an inner annulus radius which is greater than the radius of the central aperture of the positive filter. The area of the annulus determines brightness of the negative image. Other design considerations have to do with inherent aberrations of the lens system.

As indicated, the usual mode in accordance with the inventive teaching, makes use of a back focal plane filter consisting of a small on-axis circular aperture in an otherwise blocking (usually absorbing) filter. The size of the aperture determines the maximum scatter angle (e.g. of accelerated electrons) which is passed, with decreasing size increasing resolution until diffraction becomes limiting.

For simplification, discussion has been in terms of "aperture" and, in fact, filters may depend on true openings. Considerations such as need for supporting webs in the negative filter might give rise to an alternative structure depending on transparent "windows". Design considerations discussed apply to such alternative structures.

Optimal design of both positive and negative filters depends upon a number of considerations. A number of factors may play a significant role. Desired image brightness, perhaps with a view to equality as between the two images, perhaps with a view to some prescribed ratio, perhaps with a view to specific exposure needs for the particular fabrication process, may be controlling. Lens imperfections might play a role—depending upon their distribution, might lead to preference for smaller or larger apertures.

Tone reversal by alteration of illumination angle is discussed in terms specific to use of an on-axis back focal plane filter although, in principle, a "negative" filter may be used. Simple tilting, as often used in microscopy may yield to hollow cone illumination. The principle of operation of negative imaging depends upon: (a) illumination angle such that unscattered radiation does not pass through the filter and (b) statistical scattering in blocking regions to result in passage. Hollow cone illumination is accomplishable by placing an annular filter in the illumination system. See, J. M. Gibson and A. Howie, *Chemica Scripta*, Vol. 14, pp. 109-116 (1978/9). Design of the filter, in particular, the radial width of the annulus, is desirably such as to approximate the statistical results of scattering introduced in blocking regions (the angle of illumination is usefully such that the deviation relative to the path of unscattered illumination as viewed on the back focal plane filter, approximates that produced by scattering within blocking regions). Since the scattering probability is essentially unchanged between tones, the described hollow cone illumination is appropriate.

The angular spread as referenced to the normal direction, including the azimuthal spread implicit in hollow cone illumination, may have other advantages for either mode of reversal. For polycrystalline mask material, it may average out changes in scattering angle associated with different crystallites, and so result in more nearly homogeneous image brightness. Avoidance of need for filter change results in procedure simplification with its usual advantages.

Mask

Masks suitable for use in the invention invariably depend upon regions which impart a sufficiently small degree of scatter to permit selective passage or blockage by the back focal plane filter. An important design consideration for the mask depends upon the observation that aperture size adequate for needed resolution may be large as compared with that needed for the far greater demand of usual transmission electron microscopy. In terms of transmission masks, this observation gives rise under many circumstances to transparent regions of thickness sufficient for masks which are both self-supporting and of sufficiently stable dimensions for most demanding circumstances—all compatible with expediently short exposure times for available and expected resists. Experimentally, membrane thickness of 0.3 $\mu$m and 0.7 $\mu$m have been shown to be sufficiently transparent to 100 kV and 175 kV electrons respectively, to result in contrast of 70%-95% for a scatter-non-scatter system dependent upon gold blocking regions of 650 Å thickness.

In general, inventive processes depend upon "thin masks" by which is intended masks having transparent regions which are 1 $\mu$m in thickness (ordinarily this translates into a supporting membrane of that thickness). Precise thickness depends upon a number of factors, primarily the nature of the membrane material and of the radiation energy. The mean-free path for 100 kV electrons in $Si_3 N_4$ is about 600 Å. Desire for structural stability leads to a preference for membrane thickness of the order of 10 $\lambda$ (of a thickness permitting 10 scattering events) and to a maximum permissible thickness of ~30 $\lambda$. (See, *Transmission Electron Microscopy* . . . cited above at pp. 8-11, 138.) Description is here in terms of relatively low scattering angle membrane material as supporting relatively high scattering angle blocking material. In general terms, such criteria assure contrast of a degree necessary for available resist materials. Silicon oxynitride as used experimentally is illustrative of materials meeting such criteria.

Other types of masks are described in the technical literature. Work reported in *J. Vac. Sci. Technol.*, Vol. 12, No. 6, (1975) p. 1135 et sec. describes an electron beam projection system which relies on a self-supporting foil mask.

Reduced need for heat dissipation as compared with that required for absorption masks is realized by use of the scattering-nonscattering approach. For example, at a current density of $1 \times 10^{-5}$ Amp/$cm^2$, absorbed power in the mask is of the order 0.001 watt/$cm^2$ (or by contrast, assuming the same resist exposure needs, an absorbing mask would require dissipation of ~1 watt/$cm^2$).

Electrical charging is unlikely to be a serious problem at least for a scattering-non-scattering mask. If necessary, the mask may be coated with a low atomic number electrical conductor such as amorphous carbon with little effect on lithographic properties.

Taking advantage of the mask:image reduction mode, it is possible to avoid direct write in mask fabrication. 10:1 reduction permits use of conventional electromagnetic (UV) mask fabrication for attainment of 0.2 $\mu$m minimum features in the image plane.

LITHOGRAPHIC DEFINING ENERGY

Figure 3:
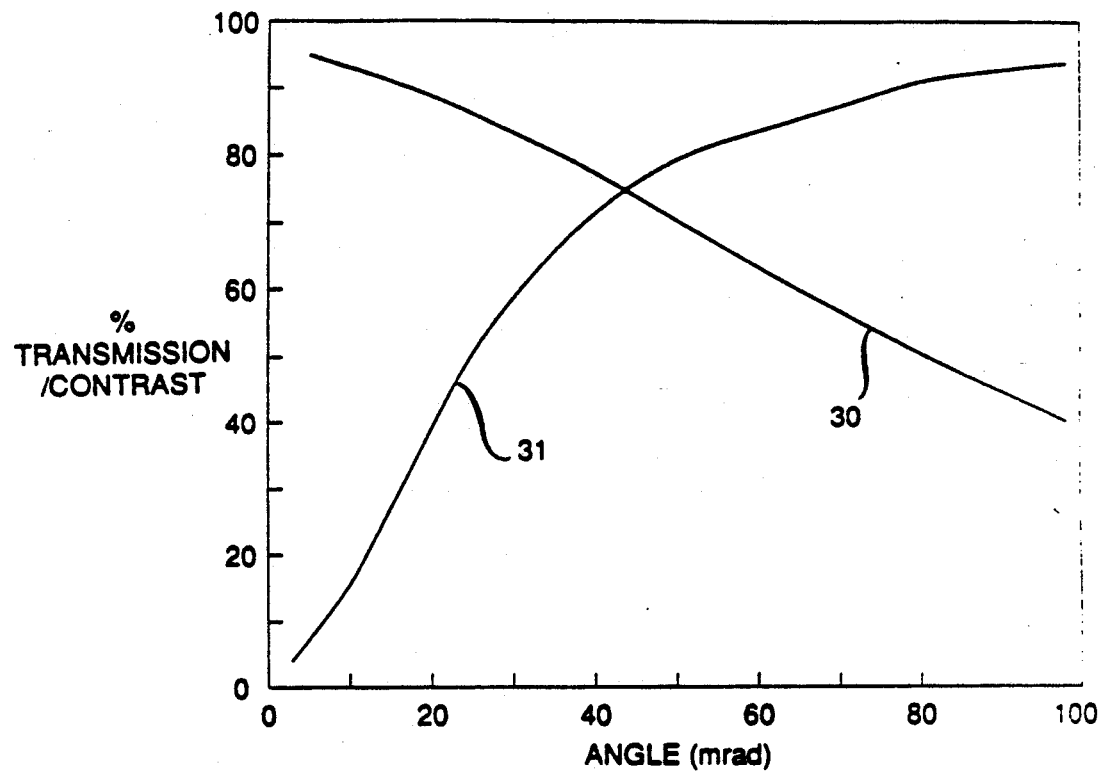
FIG. 3 on ordinate units of contrast and transmission and abscissa units of angle, relates the two ordinate quantities to acceptance angle of a back focal plane filter designed to selectively pass energy transmitted through the "transparent" mask regions.

FIG. 3 is based on 175 kV electrons. Other experiments suggest an electron energy range of up to at least 200 kV as suitable for use in ~0.2-0.35 $\mu$m fabrication (minimum feature size). Substantially lower energies (below ~50 kV) while sometimes suitable may be resolution limiting for such minimum feature size. Substantially higher energies are generally unnecessary, at least over this contemplated feature size range, so that increased expense entailed may not be justified.

Available electron sources already meet many contemplated process needs. In terms of present day chip fabrication, and assuming simultaneous illumination of the entire chip, the electron source should have capability both in terms of intensity and uniformity to illuminate a 2 cm $\times$ 2 cm chip. These conditions are attainable. For example, a hairpin tungsten filament emitter in a typical 100 kV transmission electron microscope gun can deliver a total emission current of about 100 $\mu$A, implying a current density of $2.5 \times 10^{-5}$ Acm$^{-2}$ on a 2$\times$2 cm image area. With PMMA resist at 100 kV accelerating voltage, exposure should be achieved at this current density in <100 seconds. In a following section reference is made to e-beam resists noting sensitivities as well as resolution characteristics.

Higher intensity sources are available. Large area thermionic emitters used in electron beam welding delivers emission current of 0.5 Amp and above. As combined with more sensitive resists it is unlikely that contemplated systems will be limited by exposure time. Throughputs of 40 wafers per hour are permitted. Larger throughput is limited by other considerations—e.g. specimen exchange and registration.

Presently available resists offer values of latitude and contrast to accommodate characteristics offered by electron sources. Brightness variations, both time-dependent and position-dependent, of ~10% are expected to meet typical system/resist requirements. Effective position nonuniformity may be reduced by vibrating the beam during exposure. Electromagnetic or electrostatic deflection systems are suitable for this purpose.

Electron illumination should be sufficiently parallel and perpendicular (of sufficient telecentricity) so as not to limit resolution. This translates into tolerable angular deviation of ~1 mrad and is achievable.

IMAGING APPARATUS

Figure 4:
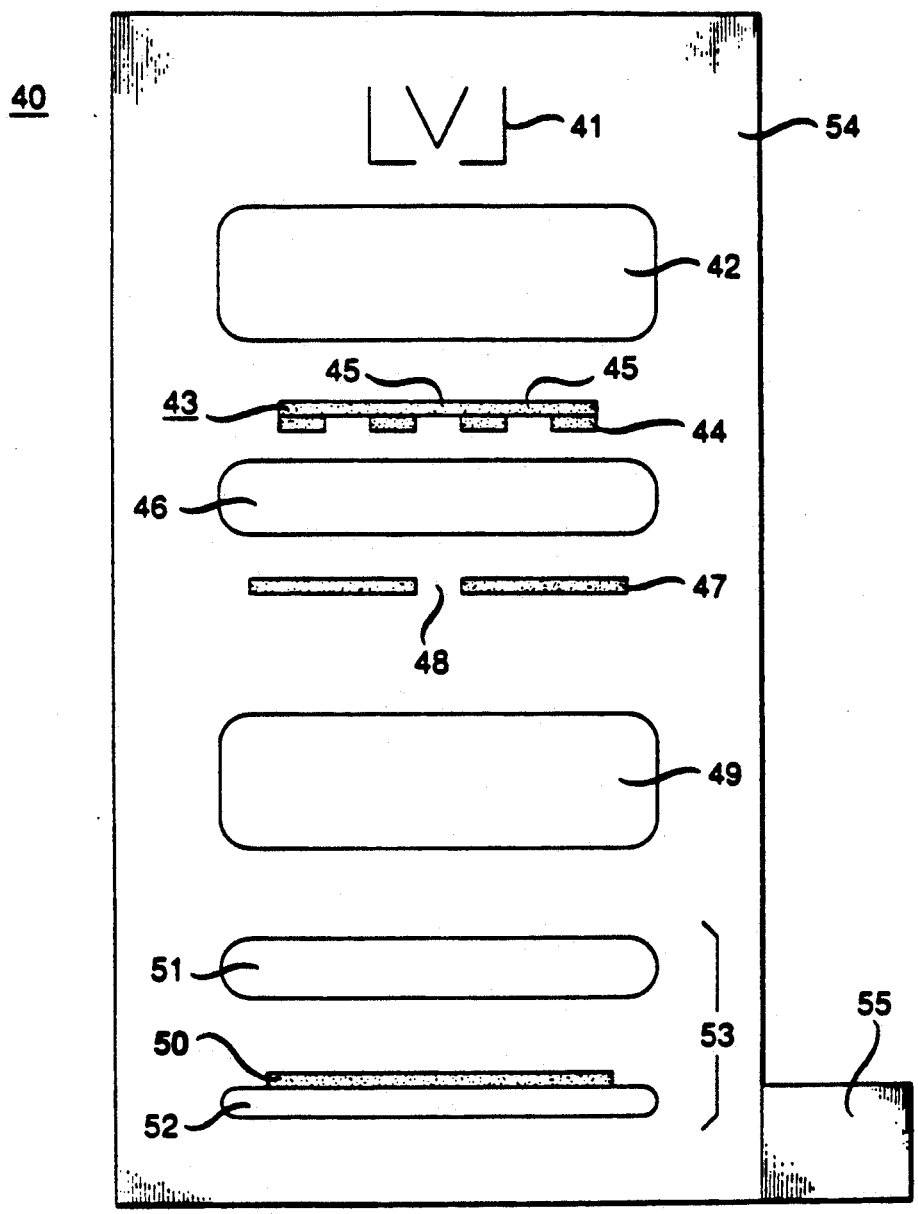
FIG. 4 is a diagrammatic view of a projection system suitably used with the invention.
Figure 6:
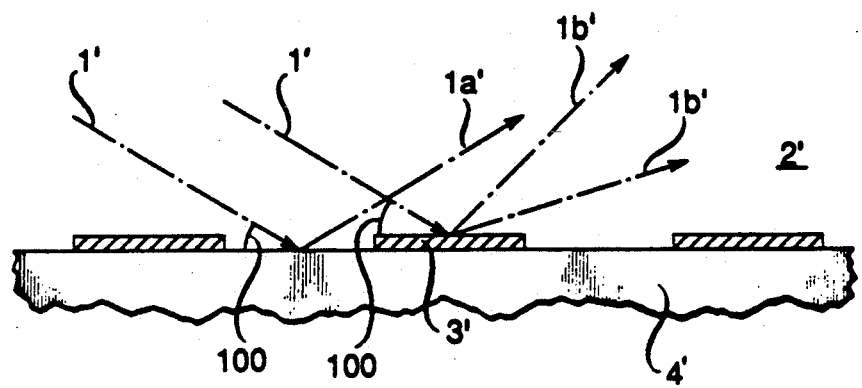
FIG. 6 is a diagrammatic view of a portion of a reflection mask which may replace the transmission mask, for example, in the systems depicted in FIGS. 1 and 2.

Characteristics have been generally discussed in conjunction with FIGS. 1 and 4. With the exception of criteria relating to selective transmission based on scatter angle, requirements are well-known. Technical papers on projection e-beam systems included *J. Vac. Sci. Technol.*, Vol. 12, No. 6 p. 1135 et sec., November/December 1975, *J. Vac. Sci. Technol.*, 16(6), November/December 1979 above, and *Proceedings of the 11th Conference* (1979) *International on Solid State Devices*, Tokyo, 1979 cited above. While these systems depend upon absorbing masks they go into considerable detail with regard to design of the elements depicted in FIG. 4. Systems for use with UV (both near UV and vacuum UV) are in commercial use or at an advanced stage of development. (See, "Semiconductor Lithography Principles Common Practices and Materials", by W. M. Moreau, Plenum Press, N. Y., 1988.

The second reference in the preceding paragraph, *Proceedings of the 11th Conference* (1979) *International on Solid State Devices*, Tokyo, 1979, is exemplary of influences on and resulting trend in electron beam lithography systems. In referring to scanning systems, it represents an art in which a prime objective is to increase the number of pixels that can be transferred in a single exposure step. The trends toward meeting these objectives are seen in the progression of electron beam lithography systems from round-beam direct-write systems. (See, *Semiconductor Lithography Principles, Practices and, Materials*, by W. M. Moreau, pp. 420–431, Plenum Press, N.Y. (1988) to shaped-beam direct-write (see, previous reference) to cell projection (see, J. Vac. Sci. Technol. B, vol. 8 (6), pp. 1836–1840, November/December 1990.) to large-field mask imaging systems. In reporting on work representing this progression, this second reference alludes to solution to a problem implicit in scanning systems, e.g. as based on shaped beam. The problem is that of resolution loss due to scanning mode which results in deviation from optimal resolution during scanning. The solution is any of a known variety of dynamic correction approaches, Dynamic correction, first contemplated in terms of mechanical movement of part of the projection equipment, has, itself, undergone a progression. Literature references include: *J. Vac. Sci. Technol.*, 15(3), May/June 1978, which, beginning at p. 849 describes the moving objective lens, as well as a series directed to use of a variable axis lens which provides for realtime relocation of the optical axis of the lens to keep it coincident with the scanning beam. References to later systems including Variable Axis Lens, Variable Axis Immersion Lens include *J. Vac. Sci. Technol.*, 19 (4), Nov/Dec. 1981, *Microcircuit Engineering* 83 ISBN 0.12044980.3*J. Vac. Sci. Technol.*, B6 (6), November/December 1988.

A recognized deficiency in electron optics results in significant image distortion and aberrations. Lens aberrations may be of lithographic significance but may be avoided by proper design. Distortion and aberration in multi lens systems may be lessened by use of compensating lenses, but may remain a problem for submicron lithography. To the extent that significant aberrations vary from lens to lens, the recommended approach is to use a single projection apparatus for all delineation-dependent processing of each device, although the realities of day-by-day processing may make this impractical. It may even be useful to print all members of a mask set in a single apparatus (particularly for fabrication of 1:1 mask sets). In this way, it is possible to locally register chip features to sufficient accuracy even though the pattern is distorted overall.

The text, *ACS Symposium Series*, "Introduction to Microlithography", ISSN 0097-6156;219 (1983) contains an excellent survey of resist compositions, and lithographic processing. The text, "VLSI Technology", edited by Sze, McGraw-Hill, Auckland, 1985 is illustrative of technical material pertaining to device fabrication.

IMAGING MATERIAL

As discussed, important forms of the invention depend on resist imaging sensitive to accelerated electrons or electromagnetic energy. The following discussion is largely in terms of accelerated electron radiation but generally applies to other resists and to direct processing.

Manufacturers describe resists as requiring a specified dose. For electron resists, dose is in units of microcoulombs/$cm^2$. The value assigned is generally that required for "large" area exposure, e.g., 10 $\mu$m $\times$ 10 $\mu$m. The explanation is the form of measurement required to determine thickness of affected areas. In general, measurement equipment requires such an area. Experience dictates that fabrication based on the micron or submicron features of the invention requires about twice the specified dose (due to lessened proximity effect).

For positive resists, the minimum dose, as ordinarily specified, is that required to result in clearing in exposed regions generally with little or no loss of thickness in unexposed regions. For most purposes, retention of 70%-80% of unexposed thickness is sufficient and is within the manufacturer specifications.

For negative resists, the minimum dose specified ordinarily provides for retention of ~50% film thickness in exposed regions.

Contrast characteristics of commercial resists are specified, sometimes graphically on coordinates of contrast percent and dose. The form of the curve is ordinarily of near-horizontal small slope for low dose, then of sharply increased slope over the region of usual exposure conditions and finally near-horizontal at the saturation level.

Two technical papers are suitably referenced as describing state of the art resist compositions—particularly for e-beam use. (See, *Solid State Technology*, "Forefront of Research on Resists", M. J. Bowden, June 1981 pp. 73–87 and *Ann. Rev. Mater. Sci.*, "Polymer Materials for Microlithography", 1987 pp. 237–269.) From this and other information, it is found that a variety of negative and positive tone resists suitable for use in the inventive processes are available or under development. Illustrative commercially available resists with resolution of at least 0.25 $\mu$m include the negative tone Chloro Methyl Styrene and the positive tone Novalac Positive Resist.

EXPERIMENTAL RESULTS

While characteristics implicit in the description thus far are calculable either on the basis of reported specifications or on the basis of physical principles, experiments were conducted for confirmation. As in much of the discussion thus far, reported work is sufficient to establish suitability of needed characteristics for the purposes of the invention. The preferred inventive approach, entailing accelerated electrons, is not so well founded. Experiments were largely conducted with a view to confirming such characteristics as applied to electron lithography.

Values of accelerating voltage required to produce inception of damage in usual semiconductor materials is set forth in the literature. Two mechanisms are of prime importance; ionization damage, and momentum transfer damage ("knock-on damage"). It is inherent in the use of the relatively high accelerating voltages that the first mechanism is likely of reduced device-consequence. Ionization damage is distributed through a greater penetration depth so that damage density is reduced, likely below levels of device consequence. To some extent, such damage may be expected to occur at depths below device-functioning material.

The second damage mechanism is characterized by a threshold in energy (by a threshold in accelerating voltage). Threshold values are known. The value reported for silicon is ~190 kV-for the compound semiconductors, III-V, II-VI, and higher order materials, threshold values are generally somewhat higher due to higher mass. Accordingly, experiments conducted and showing feasibility of accelerating voltages at or below such threshold value are of significance. In reporting this work, it is not intended to limit the invention in these terms—such inception of damage is normally of little or no device consequence. As noted, use of accelerating voltages substantially above the threshold values may be designed to take advantage of effects associated with damage.

Experiments have been conducted to establish feasibility in terms of radiation dose required for available resist materials. Again, in the instance of electron radiation such values are well known in terms of direct electron beam writing (generally utilizing accelerating voltages of ~20-30 kV). The projection lithographic approach of the invention benefits by the improvement in resolution resulting from use of higher acceleration. Experiments were therefore directed to the dose dependence on accelerating voltage. One set of experiments dealt with Poly Methyl Methacrylate, the positive tone e-beam resist commonly used in most demanding direct write fabrication. It was found that increasing accelerating voltage from 25 kV to 200 kV resulted in a needed dose increase of about 10x. Reference to a textbook and technical papers above establishes availability of an array of available as well as emerging resists, many of substantially greater sensitivity than that of PMMA.

Mask feasibility has been established. Membrane thicknesses, e.g., in the range 0.25-0.7 $\mu$m depending on supported elemental gold blocking regions well below 0.1 $\mu$m in thickness as exposed to incident electron radiation accelerated by 100 kV and 175 kV produced images of adequate resolution and contrast. The form of data presented in FIG. 3 was calculated on the basis of theory. Experimental data is consistent. Experimentally determined transmission/contrast values of 80%-10%/60%-90% in the terms reported corresponded to aperture angles in the range up to ~80 mrad.

Experiments conducted at 175 kV, using a back focal filter aperture subtending an angle of 15 mrads, have been used to resolve images with edge acuity of ~100 Å. Such images have included 0.1 $\mu$m lines through 4000 Å thick resist. Tone reversal in the image was achieved by shifting the back focal plane aperture from on-axis to ~20 mrads off the axis. The contrast for the image was approximately 90% on-axis. While not measured, the complementary image appeared to have about the same contrast.

We claim:

1. Method for device fabrication comprising at least one fabrication step including a lithographic delineation step, said delineation step using a lens system including a field-defined lens and comprising projection of patterned radiation to produce a pattern image on a body comprising a device under fabrication in order to selectively process such pattern image during the said fabrication step, in which a mask is illuminated by radiation from a charged particle radiation source to result in transmission of said patterned radiation, characterized in that the transmission path of said patterned radiation includes a "back focal plane filter" defined as positioned on the back focal plane or on some equivalent conjugate plane of such lens system, said filter including two types of filter regions, the first of which, is more transparent to said patterned radiation than the second, so that the first filter region/regions define the pass portion of said filter, said filter serving to block transmission of a part of said patterned radiation dependent upon degree of scatter as imposed by said mask, said method being further characterized in that such lithographic delineation step, itself, consists of a plurality of delineation procedures so that the pattern image on the body consists of a plurality of sub-images which are stitched together and in that image quality is enhanced by adjustment of said apparatus intermediate some such delineation procedures, such adjustment here denoted "dynamic correction".

2. Method of claim 1 in which dynamic correction consists essentially of changing the shape of such field-defined lens.

3. Method of claim 2 in which shape is changed to accommodate focal distance to the image on the body.

4. Method of claim 3 in which focal distance change is, in part, due to a prior fabrication step.

5. Method of claim 4 in which the prior fabrication step produces surface elevation change due to patterning.

6. Method of claim 5 in which such surface elevation change is due to removal of surface material.

7. Method of claim 3 in which such focal distance change is due to surface imperfections causing departure from planarity.

8. Method of claim 2 in which the shape of the lens is determined by a magnetic field and in which shape change is induced by change in such magnetic field.

9. Method of claim 8 in which such magnetic field consists essentially of a field guaranteed by an electromagnet.

10. Method of claim 2 in which the shape of the lens is determined by an electrostatic field and in which shape change is due to change in such electrostatic field.

11. Method of claim 2 in which shape is changed to assure positioning of sub-images to realize stitching precision.

12. Method of claim 1 in which dynamic correction includes relative physical positioning of at least a part of such apparatus.

13. Method of claim 12 in which the relative position of the device in fabrication is changed with respect to the mask.

14. Method of claim 1 in which the pattern image is produced on a surface of the device under fabrication.

15. Method of claim 1 in which the pattern image is produced on an imaging material which is in intimate contact with a surface of the device under fabrication.

16. Method of claim 1 in which the mask is illuminated by radiation which consists essentially of substantially parallel rays.

17. Method of claim 1 in which the said radiation source includes a radiation filter including two types of filter regions, the first of which is more transparent to said radiation than the second so that the first filter region/regions define the pass portion of said radiation filter and so that illumination of the mask is by radiation defined by the pass portion of the radiation filter.

18. Method of claim 1 in which the pass portion of the radiation filter is an aperture.

19. Method of claim 18 in which the aperture is substantially round in configuration and on the optical axis.

20. Method of claim 18 in which the aperture is substantially annular in configuration and surrounds the optical axis.

21. Method of claim 1 in which the said mask is a transmission mode mask so that patterned radiation exits the mask through a surface distinct from the surface illuminated.

22. Method of claim 21 in which scatter as imposed by the said mask is primarily responsible for patterning to produce the said patterned radiation, the said mask consisting essentially of two types of regions which differ from each other in the degree of scatter imposed, the difference in degree being sufficient for differentiation by the said filter so that radiation passed by the said filter primarily corresponds with radiation exiting one type of mask region, the two types of mask regions being designated "first mask regions" which impose a lesser degree of scatter and "second mask regions" which impose a greater degree of scatter.

23. Method of claim 22 in which the pass portion of the said filter corresponds with a relatively transparent filter region of generally circular configuration which is placed on the optical axis of the said lens system, in which the mask is illuminated by radiation consisting of substantially parallel rays and in which such rays are substantially orthogonal to the mask, so that the said patterned radiation projected on the said body consists primarily of radiation from said first mask region/regions.

24. Method of claim 22 in which the pass portion of the said filter corresponds with relatively transparent filter region which does not include the optical axis of the said lens system, so that the said patterned radiation projected on the said body consists primarily of radiation from said second mask region/regions.

25. Method of claim 24 which the transparent filter region is a substantially continuous region of generally annular configuration surrounding a relatively non-transparent filter region, the latter placed on the optical axis of the said lens system.

26. Method of claim 22 in which the pass portion of said filter corresponds with a relatively transparent filter region of generally circular configuration which is placed on the optical axis of the said lens system, in which the mask is illuminated by radiation consisting of substantially parallel rays and in which such rays deviate from orthogonal angle of incidence to the mask, so that the said patterned radiation projected on the said body consists primarily of radiation from said second mask region/regions.

27. Method of claim 1 in which the said radiation consists essentially of electrons accelerated to a voltage sufficient to meet depth of focus and penetration depth requirements of said delineation step.

28. Method of claim 27 in which the said device in the said delineation step is designed in accordance with design rules of 0.5 $\mu$m or smaller.

29. Method of claim 27 in which the said device in the said delineation step is designed in accordance with design rules of 0.2 $\mu$m or smaller.

30. Method of any of claims 28 and 29 in which at least a portion of the surface of the said device deviates from the image focal plane due to unevenness in the said surface as measured in a direction parallel to the said optical axis.

31. Method of any of claims 28 and 29 in which at least a portion of the surface of the said device deviates from the image focal plane due to device fabrication prior to the said delineation step and in which the said portion is at least partly on a plane which is at least 1 $\mu$m distant from the plane of an adjacent portion of the said surface as measured in a direction parallel to the said optical axis.

32. Method of claim 27 in which at least a portion of the surface of the said device deviates from the image focal plane due to fabrication prior to the said delineation step due to which the said portion is on a plane which is at least 1 $\mu$m distant from the plane of an adjacent portion of the said surface as measured in a direction parallel to the said optic axis, in which a continuous part of the said surface including both the said portion and the said adjacent portion is coated with imaging material so that the said patterned radiation is required to penetrate a distance of at least 1 $\mu$m through the said imaging material in at least one part of the surface in order to simultaneously pattern surface separated by at least 1 $\mu$m as measured in a direction parallel to the said optic access.

33. Method of claim 27 in which the said surface is "planarized" by deposition of imaging material presenting a free surface such that the said portion is of reduced distance from said adjacent portion as measured in a direction parallel to the said optic access.

34. Method of claim 1 in which the said fabrication step entails selective processing in which selectivity is a direct consequence of the said radiation.

35. Method of claim 34 in which selective processing consists essentially of etching within illuminated regions of the said body and in which rate of etching is accelerated by the said radiation.

36. Method of claim 35 in which etching is dependent upon etchant yielded by decomposition of gas state precursor etchant material.

37. Method of claim 34 in which selective processing consists essentially of deposition within illuminated regions of the said body, in which deposition is of deposited material yielded by gas state precursor deposition material, and in which deposition rate is accelerated by the said radiation.

38. Method of claim 1 in which the mask is a photo mask which is illuminated by photons to yield patterned electron radiation and in which such patterned electron radiation is subsequently accelerated.

39. Device fabricated in accordance with the method of claim 1.

* * * * *